(12) United States Patent
Suzuki

(10) Patent No.: US 6,507,194 B2
(45) Date of Patent: Jan. 14, 2003

(54) METHOD OF CALCULATING REMAINING BATTERY CAPACITY

(75) Inventor: Katsuhiro Suzuki, Sumoto (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/107,494

(22) Filed: Mar. 28, 2002

(65) Prior Publication Data

US 2002/0149373 A1 Oct. 17, 2002

(30) Foreign Application Priority Data

Mar. 30, 2001 (JP) .................................. 2001/098312

(51) Int. Cl.$^7$ ............................................ G01N 27/416
(52) U.S. Cl. ........................................................ 324/428
(58) Field of Search .................................. 324/427, 428, 324/426; 320/134, 136

(56) References Cited

U.S. PATENT DOCUMENTS 6,300,763 B1 * 10/2001 Kwok ......................... 320/132
6,456,988 B1 * 9/2002 Singh et al. .................. 320/166

* cited by examiner

Primary Examiner—Gregory J. Toatley, Jr.
(74) Attorney, Agent, or Firm—Wenderoth, Lind & Ponack, L.L.P.

(57) ABSTRACT

The method of calculating remaining battery capacity specifies battery discharge efficiency with discharge rate and/or temperature as parameters, and calculates remaining battery capacity from integrated discharge current based on the specified discharge efficiency. This method of calculation stores discharge efficiency as an nth order function of discharge rate and/or temperature where n is 2 or greater, computes discharge efficiency based on the stored nth order function with discharge rate and/or temperature as parameters, and calculates remaining battery capacity based on the computed discharge efficiency.

23 Claims, 7 Drawing Sheets

METHOD OF CALCULATING REMAINING BATTERY CAPACITY

This application is based on application No. 098312 filed in Japan on Mar. 30, 2001, the content of which incorporated hereinto by reference.

BACKGROUND OF THE INVENTION

This invention relates to a method of accurately determining remaining capacity of a discharging battery.

Remaining battery capacity can be calculated by subtracting discharge capacity from charge capacity. For a fully charged battery, discharge capacity is subtracted from the fully charged battery capacity. Discharge capacity is calculated from the integral of the discharge current times the discharge efficiency. Discharge efficiency varies depending on temperature and discharge rate. Discharge efficiency decreases when battery temperature decreases. Moreover, although the rate of discharge increases with high current discharge, discharge efficiency decreases. To accurately calculate remaining battery capacity, prior art methods set discharge efficiency from temperature and discharge rate, and calculate discharge capacity based on the set discharge efficiency.

FIG. 1 shows a prior art method of setting discharge efficiency. The method of this figure divides the discharge rate into a plurality of regions with boundaries determined by a plurality of inflections points. In each region, discharge efficiency is approximated by a first order linear function. The first order linear function is specified by a first constant which sets the slope and a second constant which sets an intercept. Consequently, for a specified temperature in one discharge rate region, two constants are required in memory. In the figure, the discharge rate is divided into five regions. Therefore, 10 constants are required in memory for a specified temperature. Further, to specify discharge efficiency for six different temperatures, 60 constants are required in memory.

In addition, the minimum voltage corresponding to the remaining battery capacity setting for a discharged battery also varies depending on temperature and discharge rate. FIG. 2 shows minimum voltage characteristics corresponding to remaining battery capacity which has dropped to 5%. As shown in this figure, minimum voltage at 5% remaining battery capacity can be correctly determined by specifying temperature and discharge rate. To determine minimum voltage from temperature and discharge rate, discharge rate is divided into a plurality of regions. In each region, minimum voltage is approximated by a first order linear function. This first order linear function is specified by a first constant which sets the slope and a second constant which sets an intercept in the same fashion as for discharge efficiency. Consequently, for a specified temperature in one discharge rate region, two constants are required in memory. Since the discharge rate in the figure is divided into five regions, 10 constants are required in memory for a specified temperature. Further, to specify discharge efficiency for six different temperatures, 60 constants are required in memory.

As shown in FIGS. 1 and 2, a method, which divides discharge rate into a plurality of regions and represents discharge efficiency and minimum voltage by first order linear functions in those regions, requires storage of many constants in memory. In particular, since discharge rate must be divided into many more regions for accurate determination of discharge efficiency and minimum voltage, this method has the drawback that an excessive number of constants must be stored. Further, since the linear approximation method is discontinuous at inflection points, a small change in discharge rate can result in abrupt changes in discharge efficiency and minimum voltage. Discharge efficiency and minimum voltage for a real battery do not change abruptly at any discharge rate. For this reason, a method of determining discharge efficiency and minimum voltage based on a first order linear function has difficulty accurately specifying discharge efficiency and minimum voltage for all discharge rates. Therefore, a linear approximation method has the drawback that remaining battery capacity cannot be accurately calculated.

The present invention was developed to solve the types of problems described above. Thus it is a primary object of the present invention to provide a method of calculating remaining battery capacity which can accurately determine remaining battery capacity while reducing the number of constants stored in memory.

The above and further objects and features of the invention will more fully be apparent from the following detailed description with accompanying drawings.

SUMMARY OF THE INVENTION

The method of calculating remaining battery capacity of the present invention specifies battery discharge efficiency with discharge rate as a parameter, and calculates remaining battery capacity from integrated discharge current based on the specified discharge efficiency. This method stores discharge efficiency as an nth order function of discharge rate where n is 2 or greater, computes discharge efficiency based on the nth order function in memory with discharge rate as a parameter, and calculates remaining battery capacity based on the computed discharge efficiency. In this application, the term parameter is used with a meaning equivalent to independent variable in the $3^{rd}$ order functions of the specific embodiments below.

The method of calculating remaining capacity can also specify battery discharge efficiency with temperature as a parameter, and calculate remaining battery capacity from integrated discharge current based on the specified discharge efficiency. This method stores discharge efficiency as an nth order function of temperature where n is 2 or greater, computes discharge efficiency based on the nth order function in memory with temperature as a parameter, and calculates remaining battery capacity based on the computed discharge efficiency.

Further, the method of calculating remaining capacity can also specify battery discharge efficiency with temperature and discharge rate as parameters, and calculate remaining battery capacity from integrated discharge current based on the specified discharge efficiency. This method stores discharge efficiency as an nth order function of temperature and discharge rate where n is 2 or greater, computes discharge efficiency based on the nth order function in memory with temperature and discharge rate as parameters, and calculates remaining battery capacity based on the computed discharge efficiency.

In addition, the method of calculating remaining battery capacity of the present invention specifies minimum battery voltage with discharge rate as a parameter, and determines remaining battery capacity by detecting when discharging battery voltage reaches the specified minimum voltage. This method stores minimum voltage as an nth order function of discharge rate where n is 2 or greater, computes minimum voltage based on the nth order function in memory with discharge rate as a parameter, and assumes remaining battery capacity has reached a set capacity when battery voltage drops to the computed minimum voltage.

The method of calculating remaining battery capacity can also specify minimum battery voltage with temperature as a parameter, and determine remaining battery capacity by detecting when discharging battery voltage reaches the specified minimum voltage. This method stores minimum voltage as an nth order function of temperature where n is 2 or greater, computes minimum voltage based on the nth order function in memory with temperature as a parameter, and assumes remaining battery capacity has reached a set capacity when battery voltage drops to the computed minimum voltage.

Finally, the method of calculating remaining battery capacity can also specify minimum battery voltage with temperature and discharge rate as parameters, and determine remaining battery capacity by detecting when discharging battery voltage reaches the specified minimum voltage. This method stores minimum voltage as an nth order function of temperature and discharge rate where n is 2 or greater, computes minimum voltage based on the nth order function in memory with temperature and discharge rate as parameters, and assumes remaining battery capacity has reached a set capacity when battery voltage drops to the computed minimum voltage In this method of calculating remaining battery capacity, the minimum voltage can be set to the battery voltage at 0 to 10% remaining battery capacity.

The method of calculating remaining battery capacity described above is characterized by allowing accurate determination of remaining capacity while reducing the number of constants stored in memory. This is because this method of calculating remaining battery capacity stores discharge efficiency and minimum voltage as nth order functions of discharge rate where n is 2 or greater, computes discharge efficiency and minimum voltage from discharge rate based on the nth order function in memory, and determines remaining battery capacity from the computed discharge efficiency or minimum voltage. For example, in the prior art method shown in FIGS. 1 and 2, 60 constants must be stored in memory to determine discharge efficiency or minimum voltage from discharge rate. On the contrary, in the method of the present invention shown in FIGS. 4 and 6, if discharge efficiency and minimum voltage are computed from $3^{rd}$ order functions, four constants are needed for each temperature. Therefore, discharge efficiency or minimum voltage can be computed by storing 24 constants for six temperatures. Furthermore, unlike prior art methods which calculate based on a plurality of line segments, the method described above does not have discontinuities at inflection points. This method can determine discharge efficiency and minimum voltage with greater overall precision and determine remaining battery capacity with little error.

DETAILED DESCRIPTION OF THE INVENTION

Figure 1:
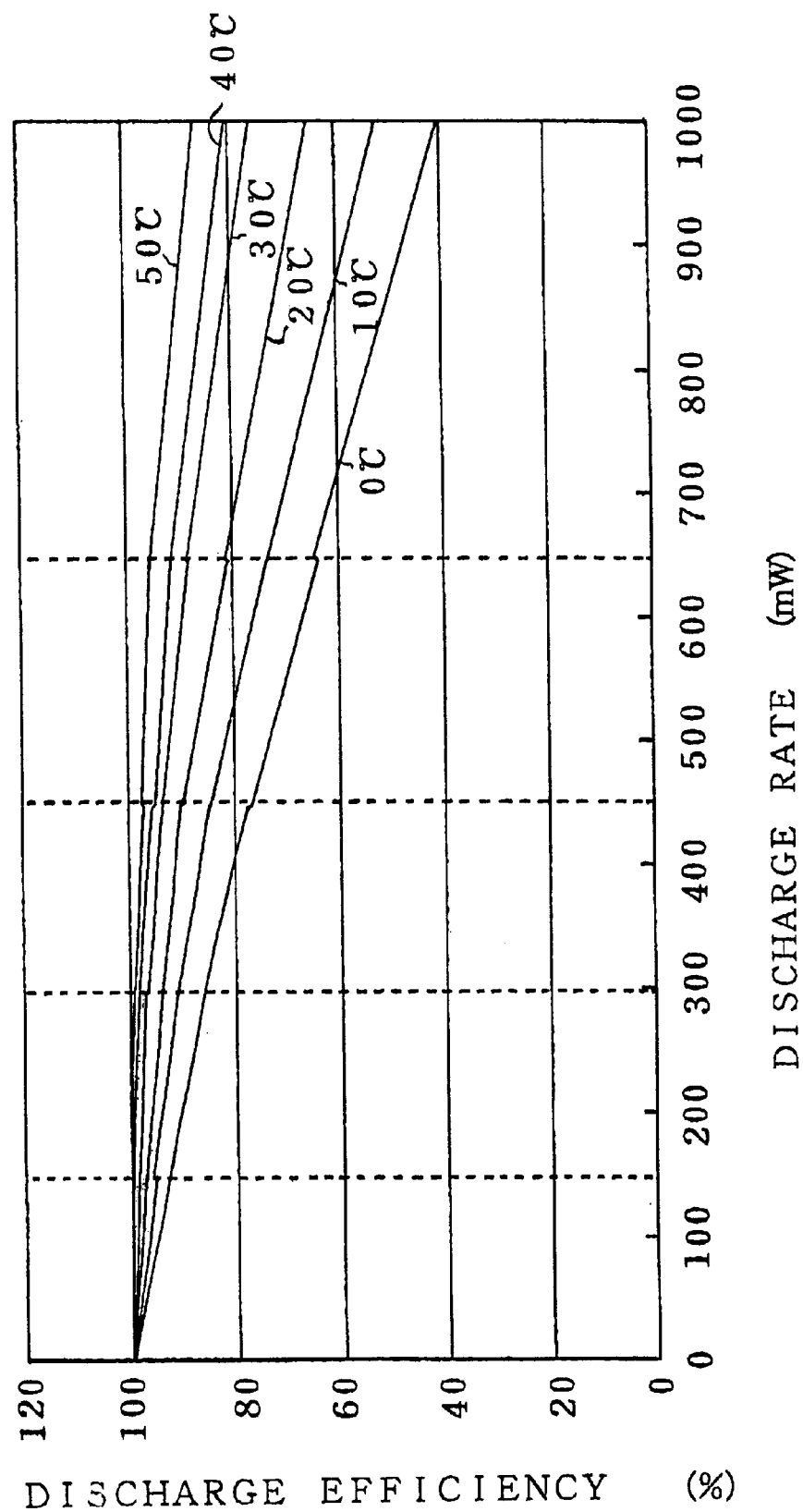
FIG. 1 is a graph showing the method of specifying discharge efficiency by a prior art method of calculation.
Figure 2:
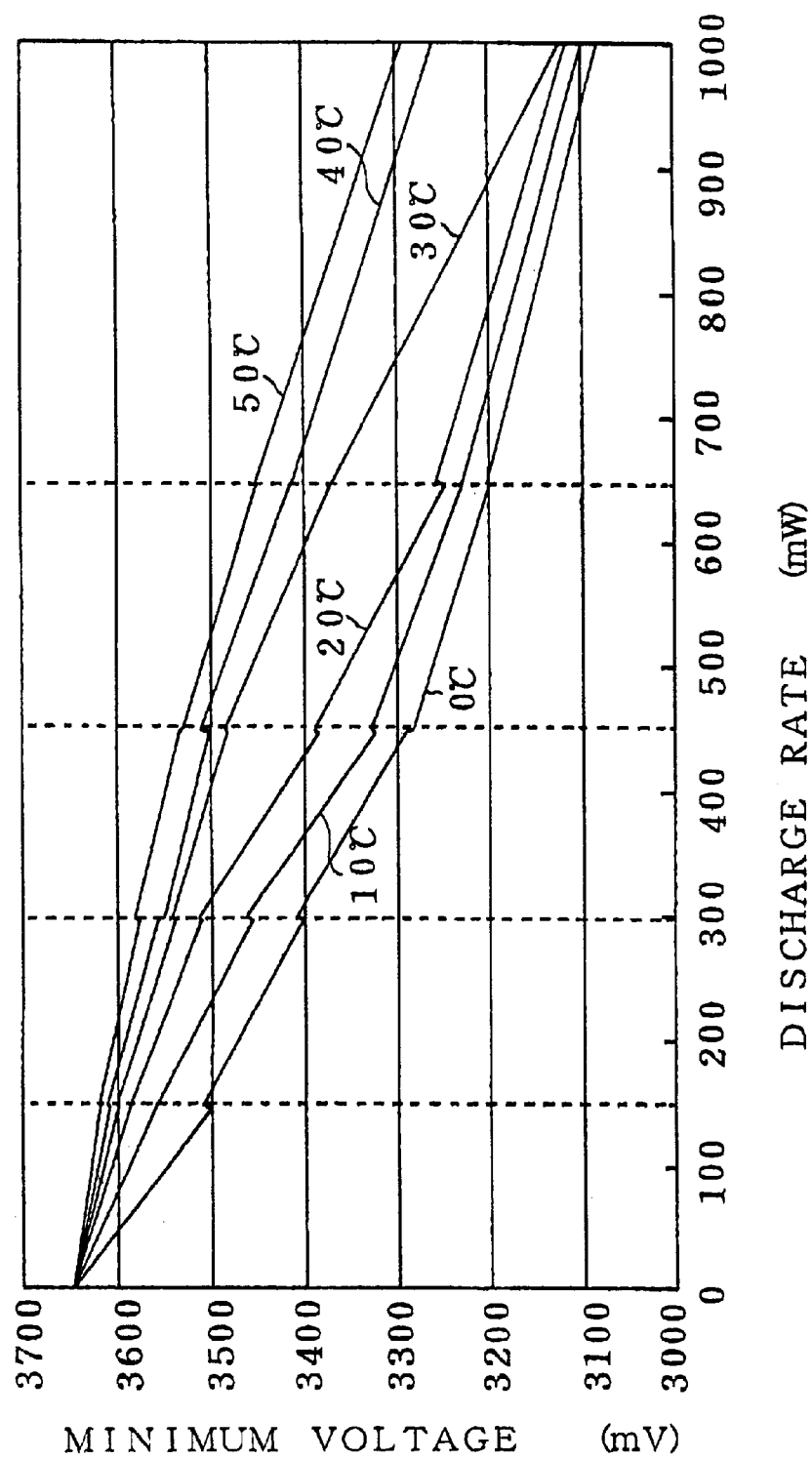
FIG. 2 is a graph showing the method of specifying minimum voltage at a remaining battery capacity of 5% by a prior art method of calculation.
Figure 3:
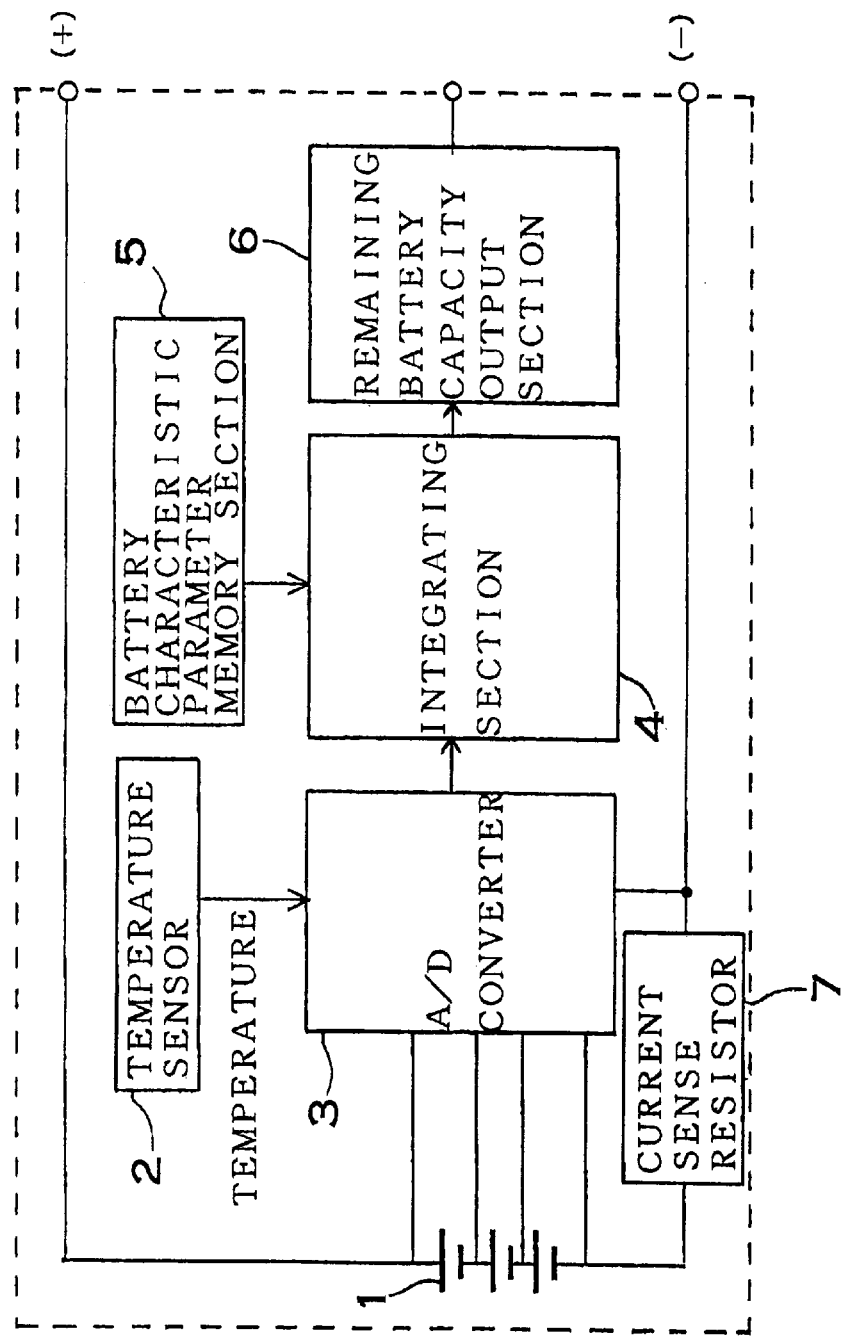
FIG. 3 is a circuit diagram of a battery pack including a circuit for calculating remaining battery capacity according to an embodiment of the present invention.

FIG. 3 is a circuit diagram of a battery pack with an internally mounted circuit to calculate remaining capacity of the batteries 1. This battery pack is provided with batteries 1, a temperature sensor 2 such as a thermistor to detect the temperature of the batteries 1 and their surroundings, an analog to digital (AND) converter 3 to convert signals input from the temperature sensor 2 as well as detected battery 1 voltage and current to digital codes, an integrating section 4 to compute remaining battery 1 capacity by operating on signals output from the A/D converter 3, a battery characteristic parameter memory section 5 to store discharge efficiency and minimum voltage used in remaining capacity calculations by the integrating section 4, and a remaining battery capacity output section to output remaining capacity computed by the integrating section 4.

The batteries 1 are lithium ion rechargeable batteries. However, the batteries may also be nickel hydrogen batteries or nickel cadmium batteries. The battery pack in this figure houses three batteries 1 connected in series, The battery pack for calculating remaining battery capacity by the method of the present invention may also house one, two, four or more batteries.

The temperature sensor 2 detects battery 1 temperature or the temperature of the ambient surrounding the batteries 1 as a change in resistance, The sensor for detecting battery 1 temperature is disposed in contact with a battery 1 surface or in close proximity to the batteries 1. A method that specifies discharge efficiency or minimum voltage according to battery 1 temperature can accurately calculate remaining capacity. However, since the surrounding temperature is determined by battery temperature, discharge efficiency and minimum voltage may also be specified by the temperature of the ambient surrounding the batteries.

The A/D converter 3 converts the temperature signal input from the temperature sensor 2, the measured battery voltages, and the voltage generated on both sides of the current sense resistor 7 to digital codes for output. To convert these three analog signals to digital signals, three A/D converter channels can be provided or one converter can be appropriately clocked and the three signals can be time division multiplexed.

The integrating section 4 operates on the signals input from the A/D converter 3 to calculate remaining battery 1 capacity. As previously described, remaining capacity is calculated by subtracting discharge capacity from charge capacity. In addition, remaining capacity is determined by detecting when the voltage of a discharging battery 1 drops to the minimum voltage. The minimum voltage is the battery 1 voltage when remaining capacity becomes equal to a specified minimum capacity. For example, minimum voltage is set to the battery 1 voltage for a remaining capacity of 5%. However, the specified capacity when battery 1 voltage becomes equal to the minimum voltage may also be set from 0 to 10%.

The integrating section 4 calculates charge capacity by integrating charging current. Here, charge capacity can be more accurately determined if the integrated charging current value is multiplied by charging efficiency. Charging efficiency is specified in the same manner as discharge efficiency with temperature and charging current as parameters. Under normal operating conditions, battery pack charging is almost always performed until full charge is reached. Full charge of a lithium ion rechargeable battery is determined by battery voltage. Full charge of a nickel hydrogen battery or nickel cadmium battery is determined by peak voltage or a ΔV voltage drop from the peak voltage. Since a fully charged battery attains full charge capacity, charge capacity can be accurately determined.

Figure 4:
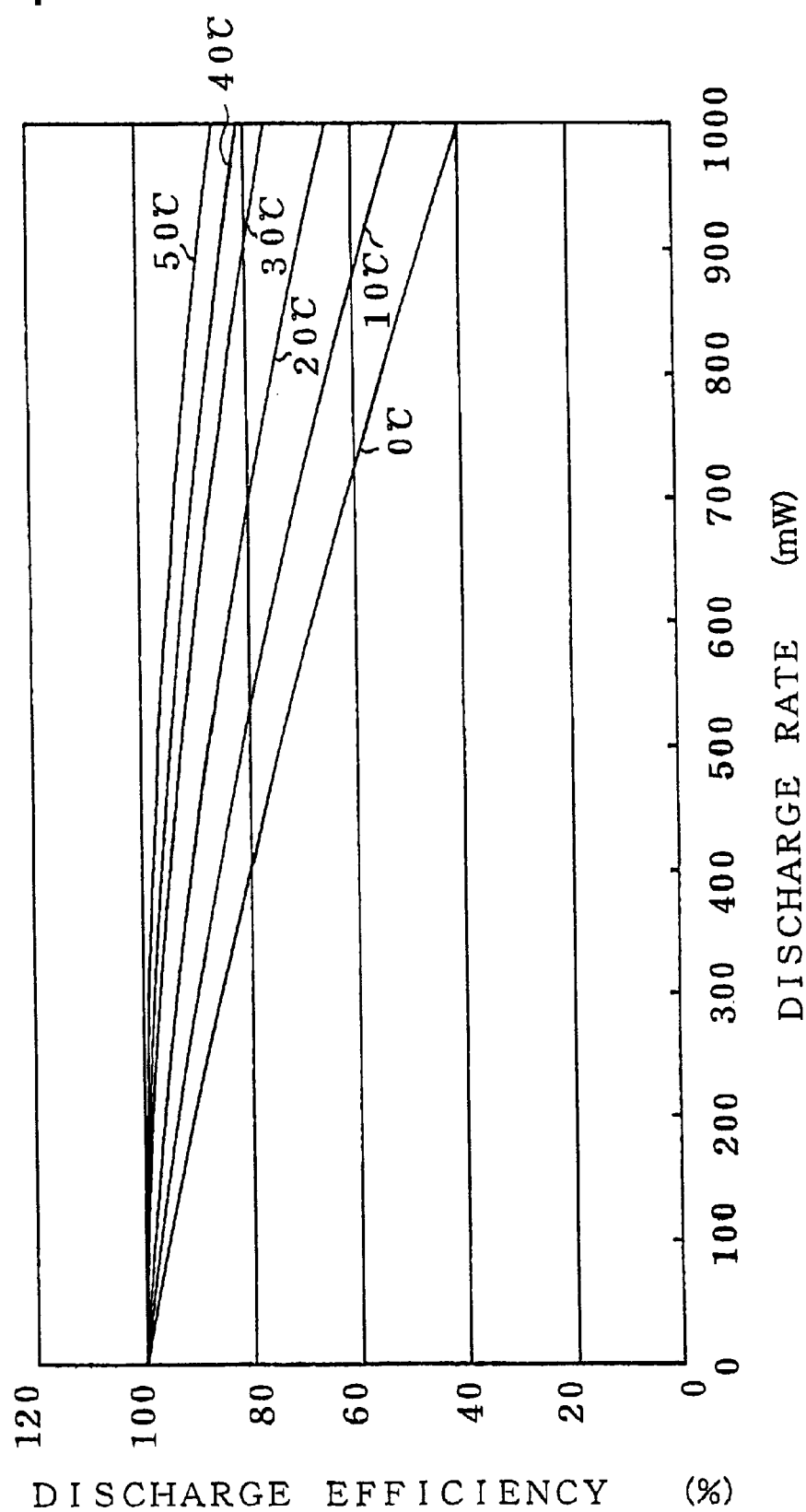
FIG. 4 is a graph specifying discharge efficiency with discharge rate as a parameter.

The integrating section 4 calculates discharge capacity from the product of the integrated discharge current and discharge efficiency. Discharge efficiency is specified with temperature and discharge rate as parameters. Data to compute discharge efficiency with temperature and discharge rate as parameters is stored in the battery characteristic parameter memory section 5. FIG. 4 is a graph showing discharge efficiency dependency on temperature and discharge rate. The battery characteristic parameter memory section 5 stores constants to compute discharge efficiency as an nth order function of discharge rate, where n is 2 or greater. FIG. 4 shows discharge efficiency specified by a $3^{rd}$ order function with discharge rate as a parameter. The $3^{rd}$ order function is given by the following general equation.

$$f(x)=ax^3+bx^2+cx+d$$

In this equation, f(x) is discharge efficiency, x is discharge rate, and a, b, c, and d are constants. The four constants, a through d, are stored in memory, and discharge efficiency is calculated from discharge rate with this equation. The four constants are stored in the battery characteristic parameter memory section 5. Discharge efficiency varies depending on temperature. Consequently, the battery characteristic parameter memory section 5 stores constants, a through d, corresponding to each temperature. The figure specifies discharge efficiency for each temperature at intervals of 10° C. over a range from 0 to 50° C. Therefore, the battery characteristic parameter memory section 5 stores six sets of constants, a through d, for each 10° C. temperature increment, and the constants, a through d, change depending on the temperature. The constants, a through d, are specified depending on the temperature, and discharge efficiency is computed from the specified constants with discharge rate as a parameter.

Battery 1 temperature does not necessarily change by 10° C. increments. For example, battery temperature may become 15° C. The discharge efficiency of batteries 1 at this temperature can be computed by linear interpolation between the discharge efficiency for 10° C. and the discharge efficiency for 20° C. A method of computing discharge efficiency by linear interpolation allows computation of discharge efficiency even at temperatures for which no constants, a through d, are stored in memory.

Figure 5:
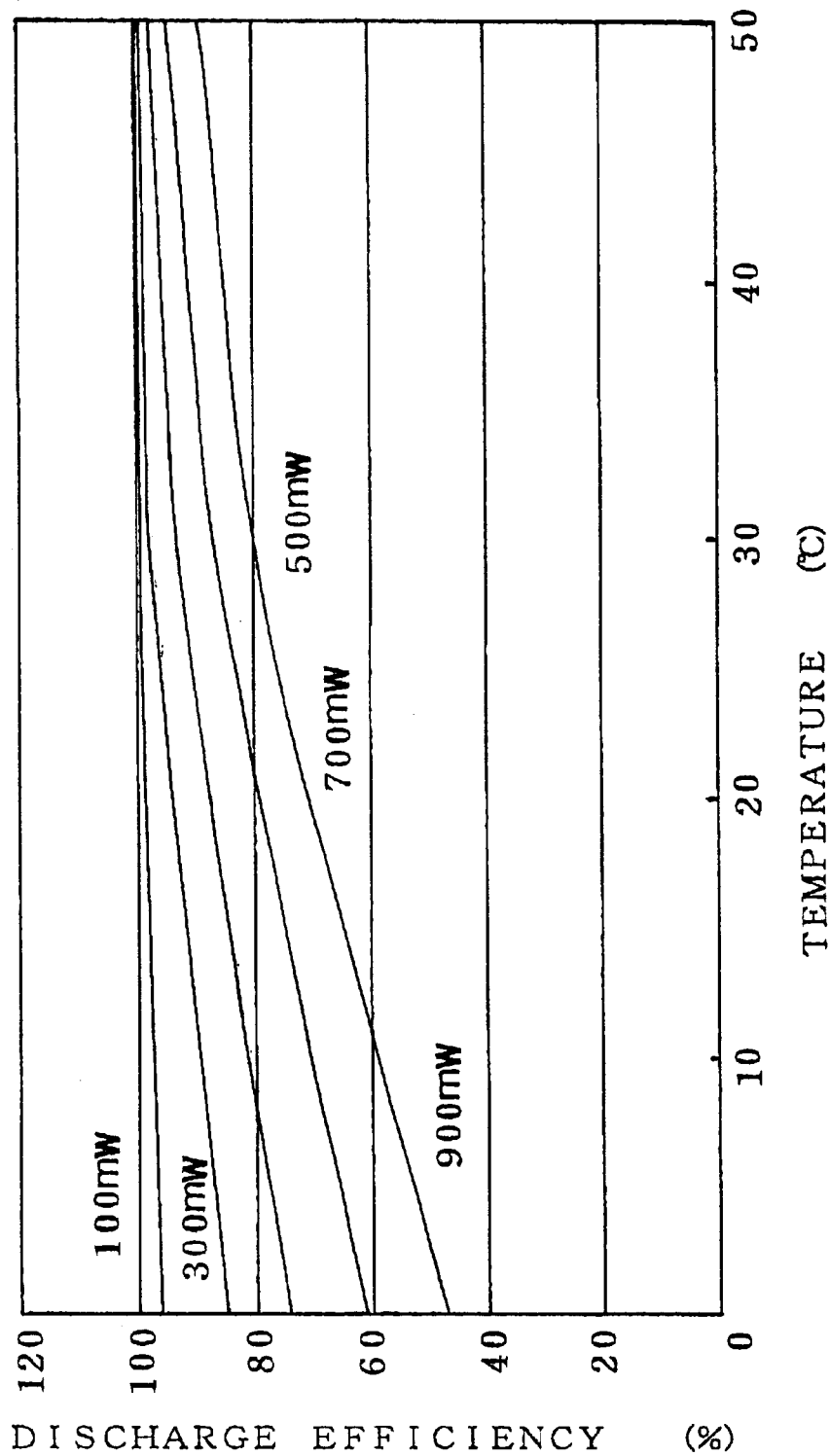
FIG. 5 is a graph specifying discharge efficiency with temperature as a parameter.

In FIG. 4, discharge efficiency is computed by selecting a different function depending on the temperature. Specifically, the constants, a through d, are specified depending on the temperature, and discharge efficiency is computed from the constants with discharge rate as a parameter. As shown in FIG. 5, the integrating section 4 can also select different functions depending on discharge rate and compute discharge efficiency. In this graph, constants, $a_1$ through $d_1$ are specified depending on discharge rate, and discharge efficiency is computed from the constants, $a_1$ through $d_1$ with temperature as a parameter.

This method specifies discharge efficiency as a $3^{rd}$ order function with temperature as a parameter, The $3^{rd}$ order function is given by the following general equation.

$$f(y)=a_1y^3+b_1y^2+c_1y+d_1$$

In this equation, f(y) is discharge efficiency, y is temperature, and $a_1$, $b_1$, $c_1$, and $d_1$ are constants. The four constants, $a_1$ through $d_1$, are stored in memory, and discharge efficiency is calculated from temperature with this equation. The four constants are stored in the battery characteristic parameter memory section 5. Discharge efficiency varies depending on discharge rate, Consequently, the battery characteristic parameter memory section 5 stores constants, $a_1$ through $d_1$, corresponding to each discharge rate. The figure specifies discharge efficiency for each discharge rate at intervals of 200 mW over a range from 0 to 1000 mW. Therefore, the battery characteristic parameter memory section 5 stores five sets of constants, a, through $d_1$, for each 200 mW discharge rate increment, and the constants, $a_1$ through $d_1$, change depending on the discharge rate. The constants, $a_1$ through $d_1$, are specified depending on discharge rate, and discharge efficiency is computed from the specified constants with temperature as a parameter.

In the same manner as temperature, discharge rate does not necessarily change by 200 mW increments. Consequently, discharge efficiency for a discharge rate between those stored in memory can be computed by linear interpolation in the same manner as was done for temperature. A method of computing discharge efficiency by linear interpolation allows computation of discharge efficiency even at discharge rates for which no constants, $a_1$ through $d_1$, are stored in memory.

Further, discharge efficiency can also be specified by the following $3^{rd}$ order function with temperature and discharge rate as parameters. This $3^{rd}$ order function is given by the following general equation.

$$f=a_2x^3+b_2x^2+c_2x+d_2+a_3y^3+b_3y^2+c_3y$$

In this equation, f is discharge efficiency, x is discharge rate, y is temperature, and $a_2$, $b_2$, $c_2$, $d_2$, $a_3$, $b_3$, and $c_3$, are constants. The seven constants are stored in memory, and discharge efficiency is calculated from temperature and discharge rate with this equation. The seven constants are stored in the battery characteristic parameter memory section 5.

Figure 6:
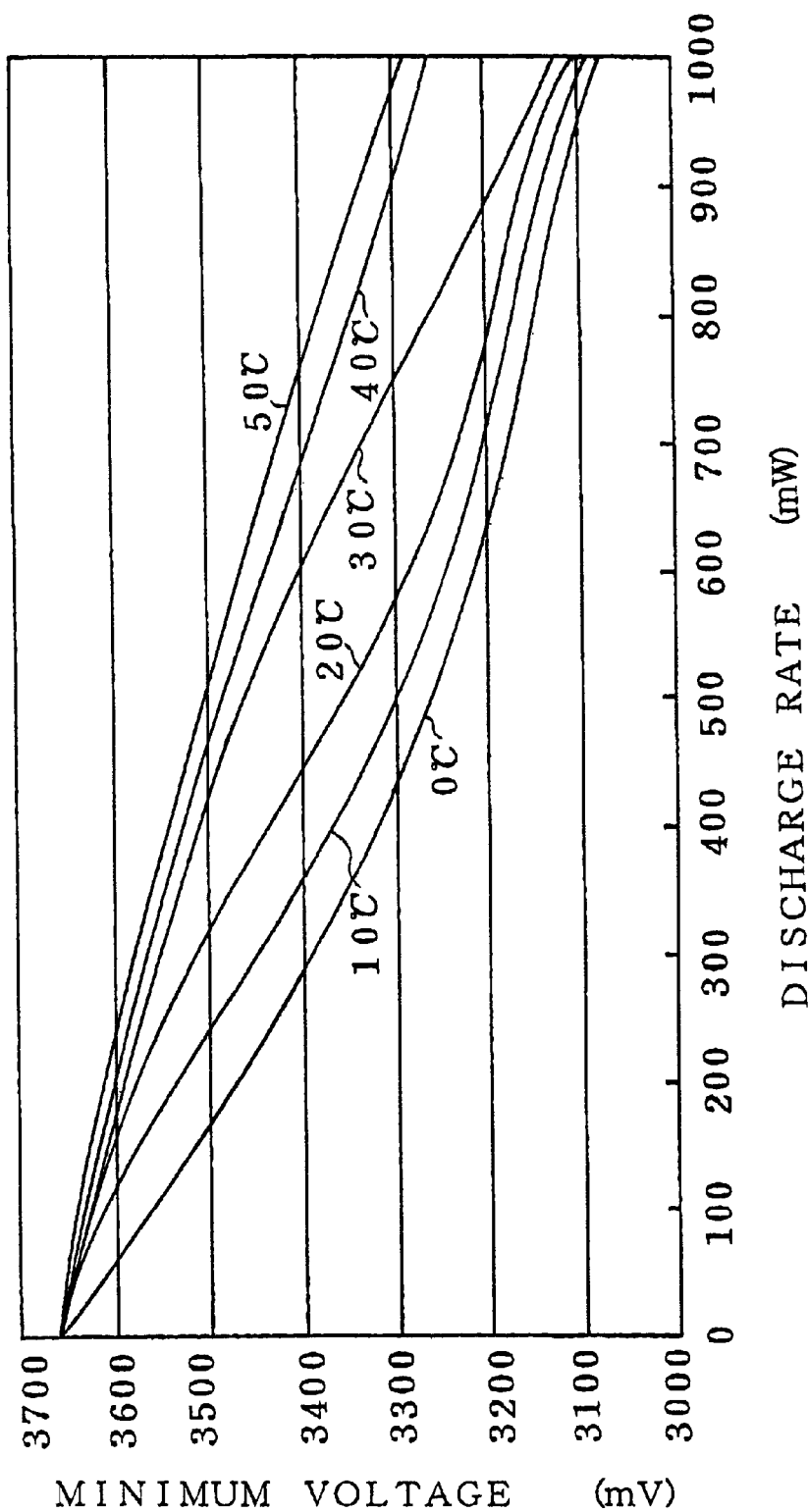
FIG. 6 is a graph specifying minimum voltage with discharge rate as a parameter.

The integrating section 4 determines minimum voltage to detect whether discharging battery 1 voltage has dropped to the minimum voltage. Minimum voltage is specified with temperature and discharge rate as parameters. Data to compute minimum voltage with temperature and discharge rate as parameters is stored in the battery characteristic parameter memory section 5. FIG. 6 is a graph showing minimum voltage dependency on temperature and discharge rate. The battery characteristic parameter memory section 5 stores constants to compute minimum voltage as an nth order function of discharge rate, where n is 2 or greater. FIG. 6 shows minimum voltage specified by a $3^{rd}$ order function with discharge rate as a parameter. This figure shows minimum voltage for a battery 1 which has discharged to a remaining capacity of 5%. The $3^{rd}$ order function is given by the following general equation.

$$Vmin=Ax^3+Bx^2+Cx+D$$

In this equation, Vmin is minimum voltage, x is discharge rate, and A, B. C, and D are constants. The four constants, A through D, are stored in memory, and minimum voltage is calculated from discharge rate with this equation. The four constants are stored in the battery characteristic parameter memory section 5. Minimum voltage varies depending on temperature, Consequently, the battery characteristic parameter memory section 5 stores constants, A through D, corresponding to each temperature. The figure specifies minimum voltage for each temperature at intervals of 10° C. over a range from 0 to 50° C. Therefore, the battery characteristic parameter memory section 5 stores six sets of constants, A through D, for each 10° C. temperature increment, and the constants, A through D, change depending on the temperature. The constants, A through D, are specified depending on the temperature, and the minimum voltage is computed from the specified constants with discharge rate as a parameter.

Since battery 1 temperature does not necessarily change by 10° C. increments, battery temperature may become 15° C. The minimum voltage for batteries 1 at this temperature can be computed by linear interpolation between the minimum voltage for 10° C. and the minimum voltage for 20° C. A method of computing minimum voltage by linear interpolation allows computation of minimum voltage even at temperatures for which no constants, A through D, are stored in memory.

Figure 7:
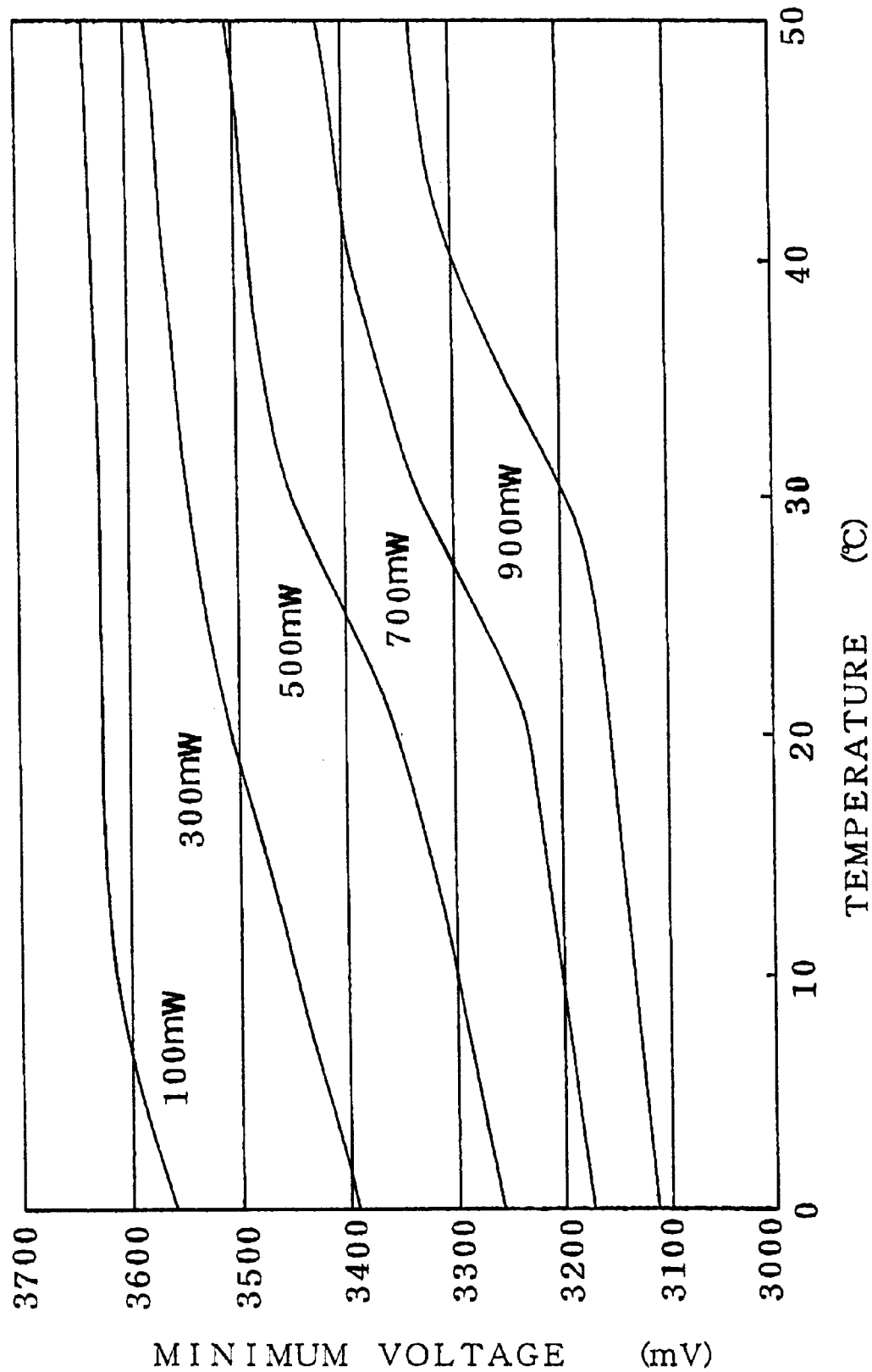
FIG. 7 is a graph specifying minimum voltage with temperature as a parameter.

In FIG. 6, minimum voltage is computed by selecting a different function depending on the temperature. Specifically, the constants, A through D, are specified depending on the temperature, and minimum voltage is computed from the constants with discharge rate as a parameter. As shown in FIG. 7, the integrating section 4 can also select different functions depending on discharge rate and compute minimum voltage. In this graph, constants, $A_1$ through $D_1$ are specified depending on discharge rate, and the minimum voltage is computed from the constants, $A_1$ through $D_1$ with temperature as a parameter.

This method specifies minimum voltage as a $3^{rd}$ order function with temperature as a parameter. The $3^{rd}$ order function is given by the following general equation.

$$V\min = A_1 y^3 + B_1 y^2 + C_1 y + D_1$$

In this equation, Vmin is minimum voltage, y is temperature, and $A_1$, $B_1$, $C_1$, and $D_1$ are constants. The four constants, $A_1$ through $D_1$, are stored in memory, and minimum voltage is calculated from temperature with this equation. The four constants are stored in the battery characteristic parameter memory section 5. Minimum voltage varies depending on discharge rate. Consequently, the battery characteristic parameter memory section 5 stores constants, $A_1$ through $D_1$, corresponding to each discharge rate. The figure specifies minimum voltage for each discharge rate at intervals of 200 mW over a range from 0 to 1000 mW. Therefore, the battery characteristic parameter memory section 5 stores five sets of constants, $A_1$ through $D_1$, for each 200 mW discharge rate increment, and the constants, $A_1$ through $D_1$, change depending on the discharge rate. The constants, $A_1$ through $D_1$, are specified depending on discharge rate, and the minimum voltage is computed from the specified constants with temperature as a parameter.

In the same manner as temperature, discharge rate does not necessarily change by 200 mW increments. Consequently, minimum voltage for a discharge rate between those stored in memory can be computed by linear interpolation in the same manner as was done for temperature. A method of computing minimum voltage by linear interpolation allows computation of minimum voltage even at discharge rates for which no constants, $A_1$ through $D_1$, are stored in memory.

Further, minimum voltage can also be specified by the following $3^{rd}$ order function with temperature and discharge rate as parameters. This $3^{rd}$ order function is given by the following general equation.

$$V\min = A_2 x^3 + B_2 x^2 + C_2 x + D_2 + A_3 y^3 + B_3 y^2 + C_3 y$$

In this equation, Vmin is minimum voltage, x is discharge rate, y is temperature, and $A_2$, $B_2$, $C_2$, $D_2$, $A_3$, $B_3$, and $C_3$, are constants. The seven constants are stored in memory, and minimum voltage is calculated from temperature and discharge rate with this equation. The seven constants are stored in the battery characteristic parameter memory section 5.

In the above method, discharge efficiency and minimum voltage are computed by $3^{rd}$ order functions. However, these computations can also be performed by $4^{th}$ order or greater functions, or by $2^{nd}$ order functions. A method of calculation by a $4^{th}$ order function computes discharge efficiency or minimum voltage from five constants, and a method of calculation by a $2^{nd}$ order function computes discharge efficiency or minimum voltage from three constants. For the general case of discharge efficiency or minimum voltage calculation by an nth order function, the battery characteristic parameter memory section 5 stores n+1 constants in memory. The optimum value of n in a method of calculating discharge efficiency or minimum voltage by an nth order function is set to a value which can reduce the error and simplify the computation.

The remaining battery 1 capacity computed by the integrating section 4 is output from the remaining battery capacity output section 6 to electronic components such as a microprocessor mounted within the battery pack.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A method of calculating remaining battery capacity by specifying battery discharge efficiency with discharge rate as a parameter, and calculating remaining battery capacity from integrated discharge current based on the specified discharge efficiency, wherein discharge efficiency is stored as an nth order function of discharge rate where n is 2 or greater, discharge efficiency is computed based on the stored nth order function with discharge rate as a parameter, and remaining battery capacity is calculated based on the computed discharge efficiency.

2. A method of calculating remaining battery capacity as recited in claim 1 wherein discharge efficiency is stored as an $3^{rd}$ order function of discharge rate, discharge efficiency is computed based on the stored $3^{rd}$ order function with discharge rate as a parameter, and remaining battery capacity is calculated based on the computed discharge efficiency.

3. A method of calculating remaining battery capacity as recited in claim 2 wherein discharge efficiency is stored as the $3^{rd}$ order function of discharge rate below, discharge efficiency is computed based on this $3^{rd}$ order function with discharge rate as a parameter, and remaining battery capacity is calculated based on the computed discharge efficiency, $$f(x) = ax^3 + bx^2 + cx + d$$

in this equation, f(x) is discharge efficiency, x is discharge rate, and a, b, c, and d are constants.

4. A method of calculating remaining battery capacity as recited in claim 3 wherein the constants, a through d, change corresponding to each temperature.

5. A method of calculating remaining battery capacity by specifying battery discharge efficiency with temperature as a parameter, and calculating remaining battery capacity from integrated discharge current based on the specified discharge efficiency, wherein discharge efficiency is stored as an nth order function of temperature where n is 2 or greater, discharge efficiency is computed based on the stored nth order function with temperature as a parameter, and remaining battery capacity is calculated based on the computed discharge efficiency.

6. A method of calculating remaining battery capacity as recited in claim 5 wherein discharge efficiency is stored as an $3^{rd}$ order function of temperature, discharge efficiency is computed based on the stored $3^{rd}$ order function with temperature as a parameter, and remaining battery capacity is calculated based on the computed discharge efficiency.

7. A method of calculating remaining battery capacity as recited in claim 6 wherein discharge efficiency is stored as the $3^{rd}$ order function of temperature below, discharge efficiency is computed based on this $3^{rd}$ order function with temperature as a parameter, and remaining battery capacity is calculated based on the computed discharge efficiency, $$f(y)=a_1 y^3+b_1 y^2+c_1 y+d_1$$

in this equation, f(y) is discharge efficiency, y is temperature, and $a_1$, $b_1$, $c_1$, and $d_1$ are constants.

8. A method of calculating remaining battery capacity by specifying battery discharge efficiency with temperature and discharge rate as parameters, and calculating remaining battery capacity from integrated discharge current based on the specified discharge efficiency, wherein discharge efficiency is stored as an nth order function of temperature and discharge rate where n is 2 or greater, discharge efficiency is computed based on the stored nth order function with temperature and discharge rate as parameters, and remaining battery capacity is calculated based on the computed discharge efficiency.

9. A method of calculating remaining battery capacity as recited in claim 8 wherein discharge efficiency is computed from a $3^{rd}$ order function with temperature and discharge rate as parameters, and remaining battery capacity is calculated based on the computed discharge efficiency.

10. A method of calculating remaining battery capacity as recited in claim 9 wherein discharge efficiency is stored as the $3^{rd}$ order function of discharge rate and temperature below, discharge efficiency is computed based on this $3^{rd}$ order function with discharge rate and temperature as parameters, and remaining battery capacity is calculated based on the computed discharge efficiency, $$f=a_2 x^3+b_2 x^2+c_2 x+d_2+a_3 y^3+b_3 y^2+c_3 y$$

in this equation, f is discharge efficiency, x is discharge rate, y is temperature, and $a_2$, $b_2$, $c_2$, $d_2$, $a_3$, $b_3$, and $c_3$, are constants.

11. A method of calculating remaining battery capacity by specifying minimum battery voltage with discharge rate as a parameter, and determining remaining battery capacity by detecting when the voltage of the discharging batteries becomes equal to the specified minimum voltage, wherein minimum voltage is stored as an nth order function of discharge rate where n is 2 or greater, minimum voltage is computed based on the stored nth order function with discharge rate as a parameter, and remaining battery capacity is assumed to be a prescribed capacity when battery voltage drops to the computed minimum voltage.

12. A method of calculating remaining battery capacity as recited in claim 11 wherein minimum voltage is specified as an $3^{rd}$ order function with discharge rate as a parameter.

13. A method of calculating remaining battery capacity as recited in claim 12 wherein minimum voltage is stored as the $3^{rd}$ order function of discharge rate below, $$V\min=Ax^3+Bx^2+Cx+D$$

in this equation, Vmin is minimum voltage, x is discharge rate, and A, B, C, and D are constants.

14. A method of calculating remaining battery capacity as recited in claim 13 wherein the constants, A through D, change corresponding to each temperature.

15. A method of calculating remaining battery capacity as recited in claim 11 wherein the minimum voltage is set to the voltage at a remaining battery capacity of 0 to 10%.

16. A method of calculating remaining battery capacity by specifying minimum battery voltage with temperature as a parameter, and determining remaining battery capacity by detecting when the voltage of the discharging batteries becomes equal to the specified minimum voltage, characterized in that minimum voltage is stored as an nth order function of temperature where n is 2 or greater, minimum voltage is computed based on the stored nth order function with temperature as a parameter, and remaining battery capacity is assumed to be a prescribed capacity when battery voltage drops to the computed minimum voltage.

17. A method of calculating remaining battery capacity as recited in claim 16 wherein minimum voltage is specified as an $3^{rd}$ order function with temperature as a parameter.

18. A method of calculating remaining battery capacity as recited in claim 17 wherein minimum voltage is stored as the $3^{rd}$ order function of temperature below, $$V\min=A_1 y^3+B_1 y^2+C_1 y+D_1$$

in this equation, Vmin is minimum voltage, y is temperature, and $A_1$, $B_1$, $C_1$, and $D_1$ are constants.

19. A method of calculating remaining battery capacity as recited in claim 16 wherein the minimum voltage is set to the voltage at a remaining battery capacity of 0 to 10%.

20. A method of calculating remaining battery capacity by specifying minimum battery voltage with temperature and discharge rate as parameters, and determining remaining battery capacity by detecting when the voltage of the discharging batteries becomes equal to the specified minimum voltage, characterized in that minimum voltage is stored as an nth order function of temperature and discharge rate where n is 2 or greater, minimum voltage is computed based on the stored nth order function with temperature and discharge rate as parameters, and remaining battery capacity is assumed to be a prescribed capacity when battery voltage drops to the computed minimum voltage.

21. A method of calculating remaining battery capacity as recited in claim 20 wherein minimum voltage is specified as an $3^{rd}$ order function with temperature and discharge rate as parameters.

22. A method of calculating remaining battery capacity as recited in claim 21 wherein minimum voltage is stored as the $3^{rd}$ order function of temperature and discharge rate below, $$V\min=A_2 x^3+B_2 x^2+C_2 x+D_2+A_3 y^3+B_3 y^2+C_3 y$$

in this equation, Vmin is minimum voltage, x is discharge rate, y is temperature, and $A_2$, $B_2$, $C_2$, $D_2$, $A_3$, $B_3$, and $C_3$, are constants.

23. A method of calculating remaining battery capacity as recited in claim 20 wherein the minimum voltage is set to the voltage at a remaining battery capacity of 0 to 10%.

* * * * *